(12) United States Patent
Tsironis

(10) Patent No.: US 9,310,410 B1
(45) Date of Patent: Apr. 12, 2016

(54) LOAD AND SOURCE PULL TEST SYSTEM FOR RF AND BASEBAND FREQUENCIES

(71) Applicant: Christos Tsironis, Kirkland (CA)

(72) Inventor: Christos Tsironis, Kirkland (CA)

( * ) Notice: Subject to any disclaimer, the term of this patent is extended or adjusted under 35 U.S.C. 154(b) by 425 days.

(21) Appl. No.: 13/792,975

(22) Filed: Mar. 11, 2013

Related U.S. Application Data

(63) Continuation of application No. 13/371,587, filed on Feb. 13, 2012, now abandoned.

(51) Int. Cl.
  *G01R 27/32* (2006.01)
  *G01R 27/28* (2006.01)

(52) U.S. Cl.
  CPC ........................... *G01R 27/28* (2013.01)

(58) Field of Classification Search
  CPC ....................................................... G01R 27/32
  USPC ................. 324/615; 333/263, 17.3, 17, 3
  See application file for complete search history.

(56) References Cited

U.S. PATENT DOCUMENTS

| | | | |
|---|---|---|---|
| 6,674,293 | B1 | 1/2004 | Tsironis |
| 7,385,461 | B2 * | 6/2008 | Benedikt ........................ 333/117 |
| 7,646,267 | B1 * | 1/2010 | Tsironis ........................ 333/263 |
| 7,646,268 | B1 * | 1/2010 | Tsironis ........................ 333/263 |
| 8,933,707 | B1 | 1/2015 | Tsironis |
| 2006/0279275 | A1 * | 12/2006 | Simpson ..................... 324/158.1 |

OTHER PUBLICATIONS

"Three Probe Tuner Multiple Tasks," Microwaves &RF Magazine, Feb. 2005, p. 90.
"High-Power Load Pull at 40 MHz Using Low Frequency iTuners (iLFT)," Power-point presentation at IMS 2007.
Adjacent Channel Power ration (ACPR), application note, Anritsu Corporation.
"Error Vector Magnitude (EVM)," article from Wikipedia.
"Intermodulation (IMD)," article from Wikipedia.
"RF Directional Couplers and 3dB Hybrids: Overview," application note M560, MA/COM.
"3dB Couplers (Coaxial)," catalogue, Cernex Inc.
U.S. Appl. No. 11/498,241, "Load pull tuner using self-aligning single and double probes".

* cited by examiner

*Primary Examiner* — Arleen M Vazquez
*Assistant Examiner* — Brent J Andrews

(57) ABSTRACT

A load pull measurement setup allows independent impedance tuning at RF frequencies at the output of the DUT as well as independent tuning at RF and baseband frequencies of the modulated signal at the input of the DUT. This allows optimizing baseband frequency impedances for nonlinear amplifier performance when processing modulated signal, such as IMD, ACPR etc. Baseband tuning is done using a low frequency programmable impedance tuner, which is connected through the input bias tee, which acts as a frequency separator (diplexer). The input bias tee may be an LC based network or a 3 dB matched coupler based network.

7 Claims, 13 Drawing Sheets

Load Pull setup using Coupler based bias tee and Low Frequency Tuner to control Bias Network Impedance.

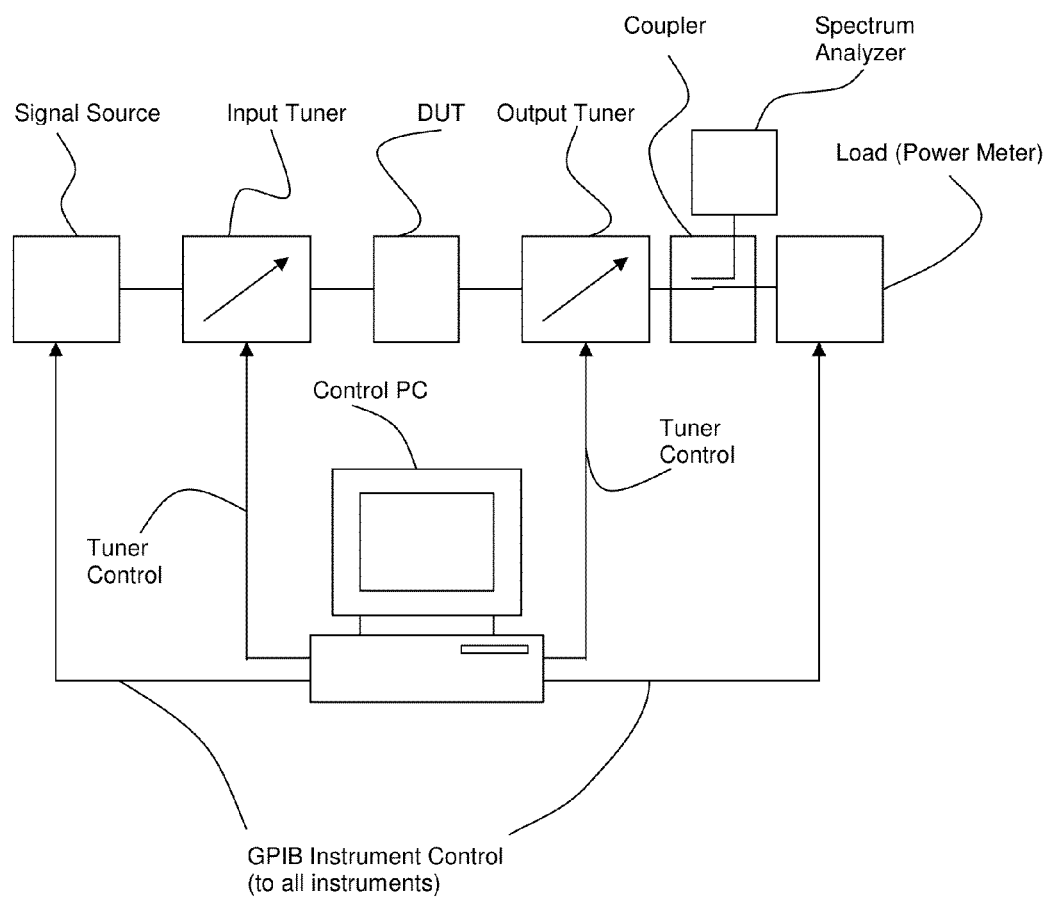
FIGURE 1: Prior art, typical automated load pull test setup.

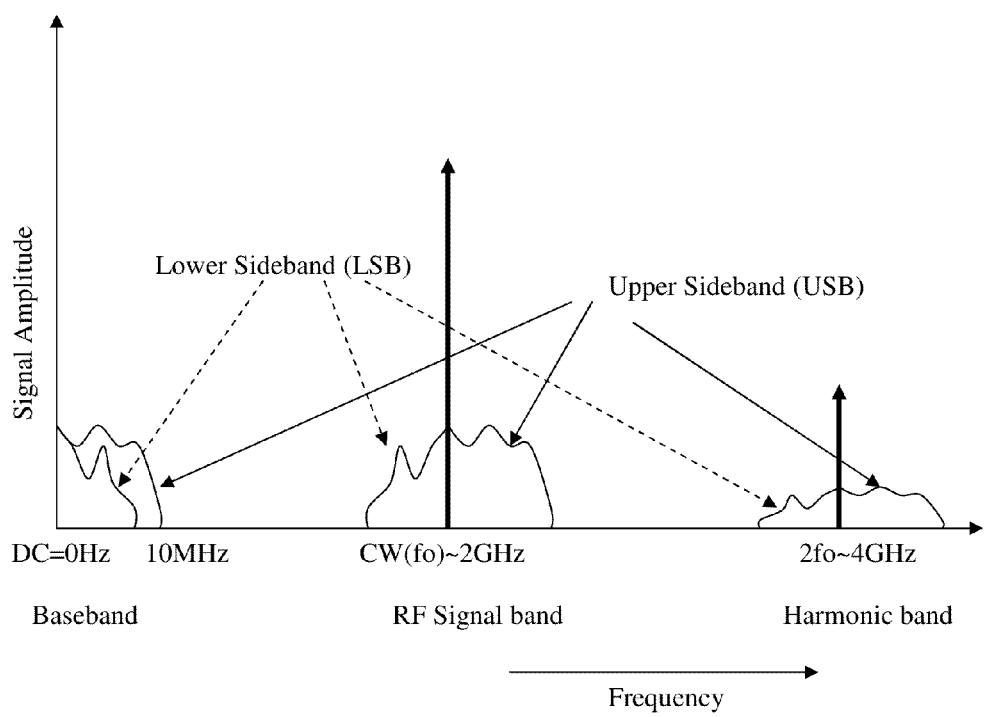
FIGURE 2: Prior art: Modulated signal amplified and down-converted by a nonlinear transistor.

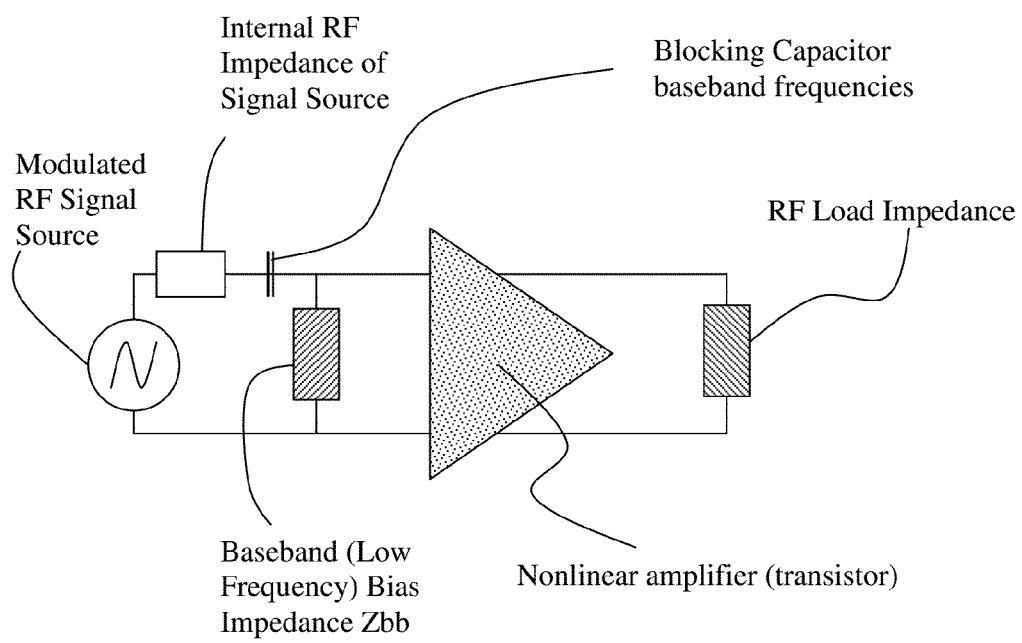
FIGURE 3: Prior art: Baseband impedance effect on transistor amplifier operation

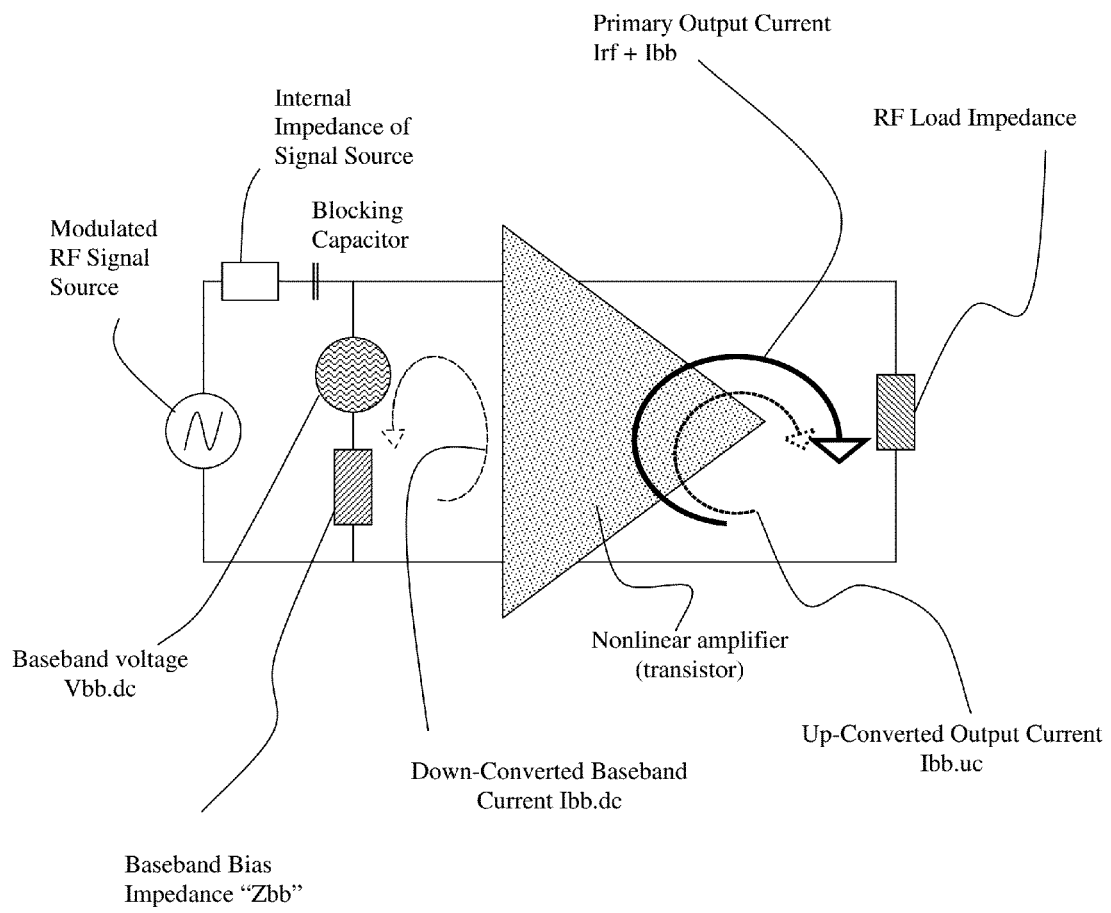
FIGURE 4: Baseband impedance effect on transistor amplifier operation.

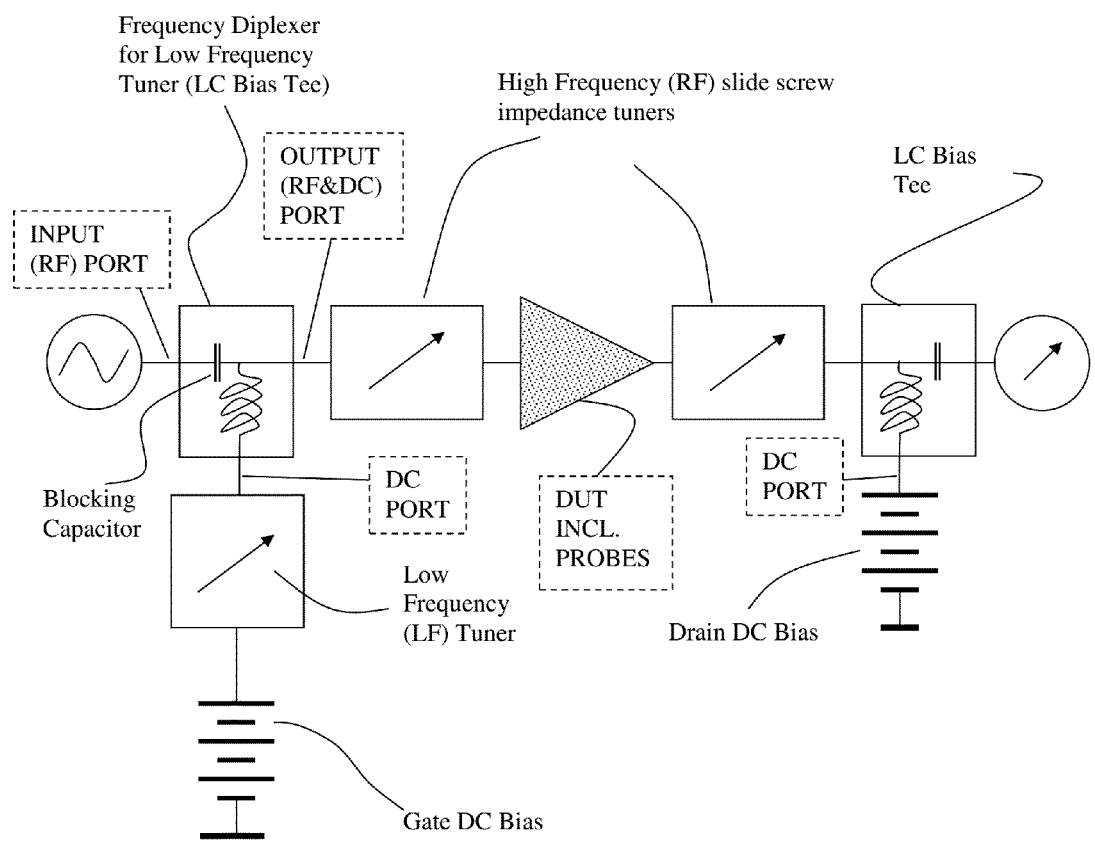
FIGURE 5: Load Pull setup using LC bias tee and Low Frequency Tuner to control Bias Network Impedance.

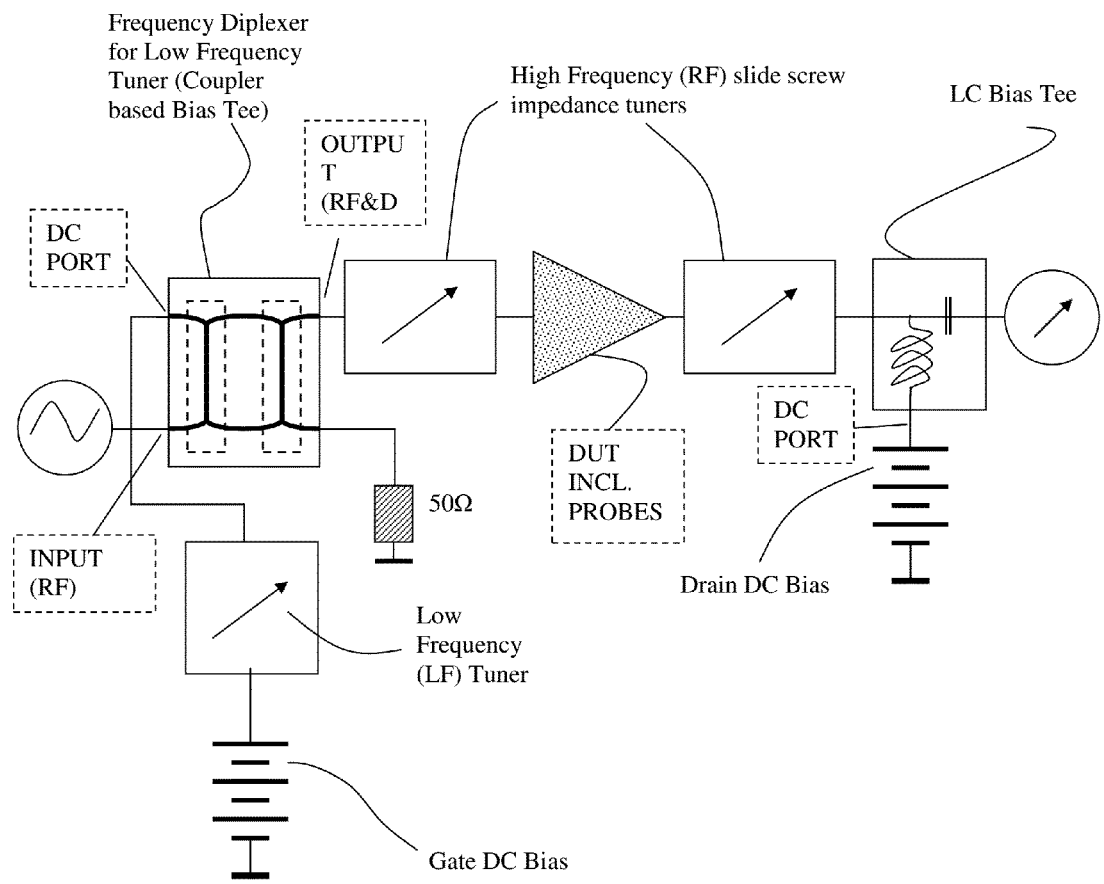
FIGURE 6: Load Pull setup using Coupler based bias tee and Low Frequency Tuner to control Bias Network Impedance.

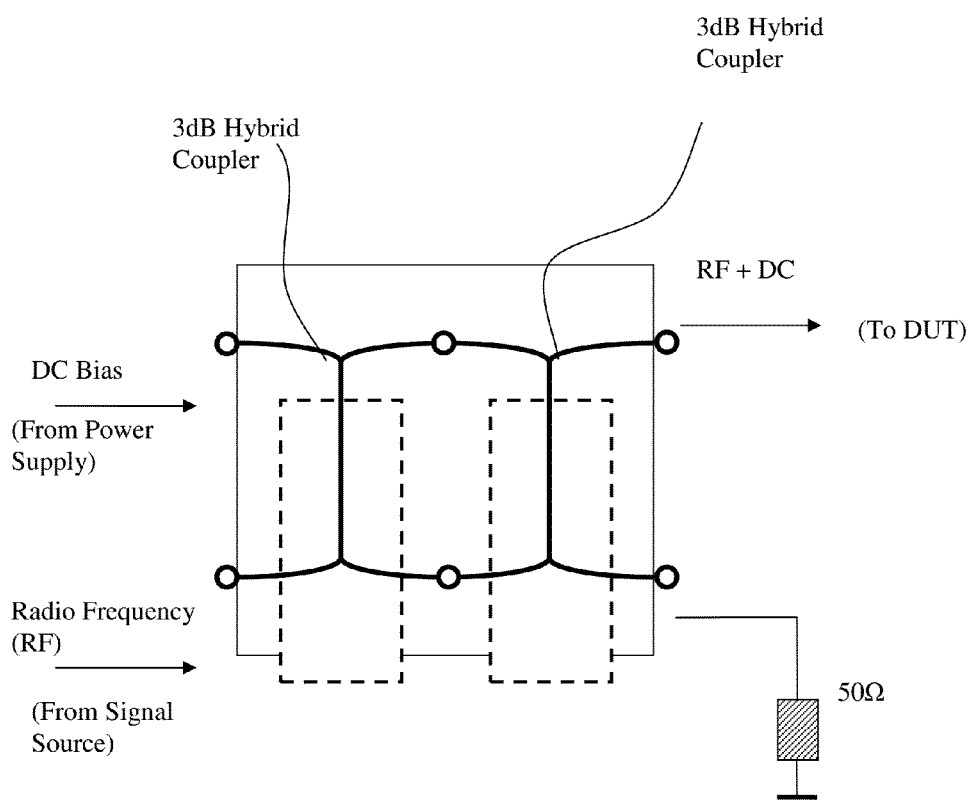
FIGURE 7: 3dB Coupler-based bias tee allowing RF and DC power to be combined at one port of the four-port bias network.

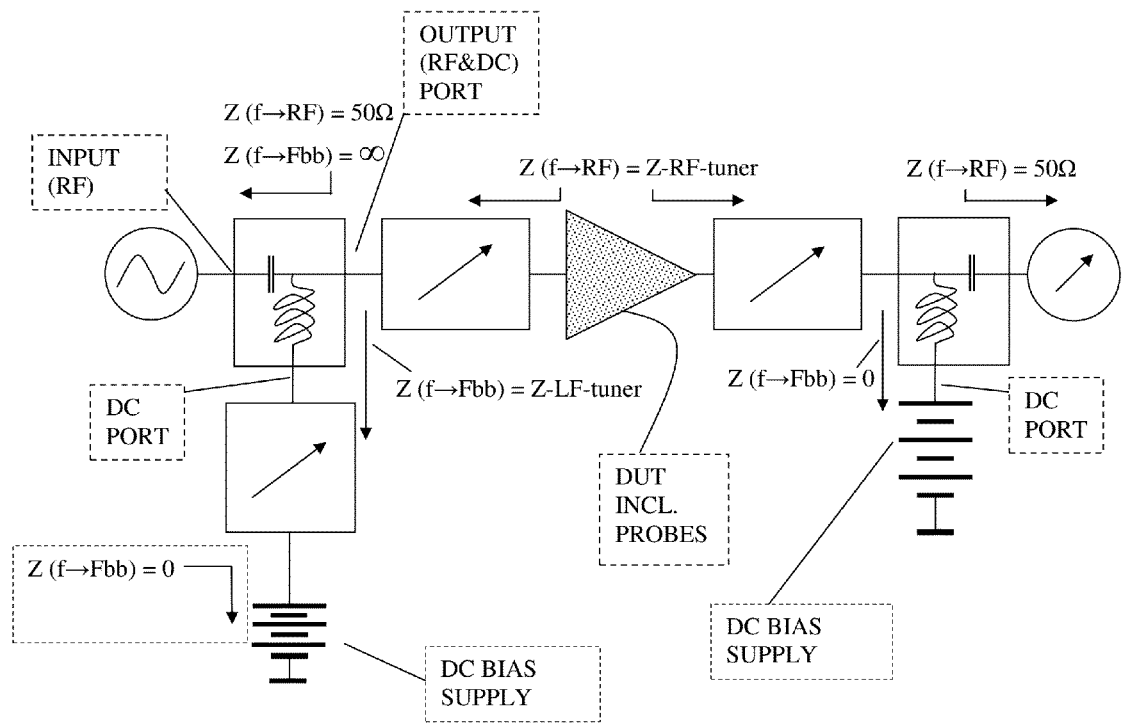
FIGURE 8: Impedances seen in the setup of FIGURE 5 for RF~1-5 GHz and baseband ~1-20MHz frequency ranges.

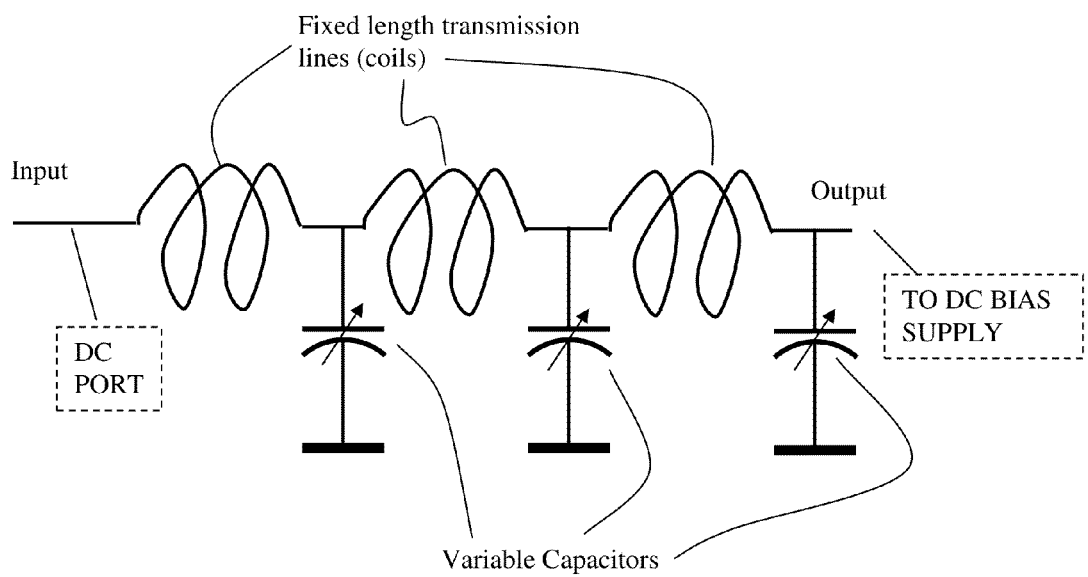
FIGURE 9: Prior art: Low frequency impedance tuner.

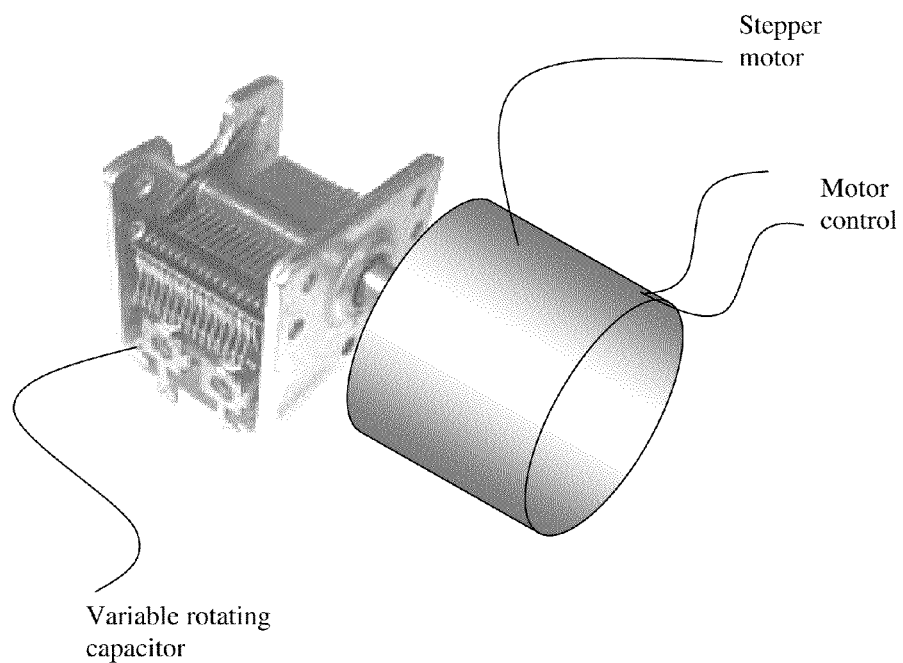
FIGURE 10: Prior art: Rotating air capacitor mounted on stepper motor, as used in Low Frequency Tuner

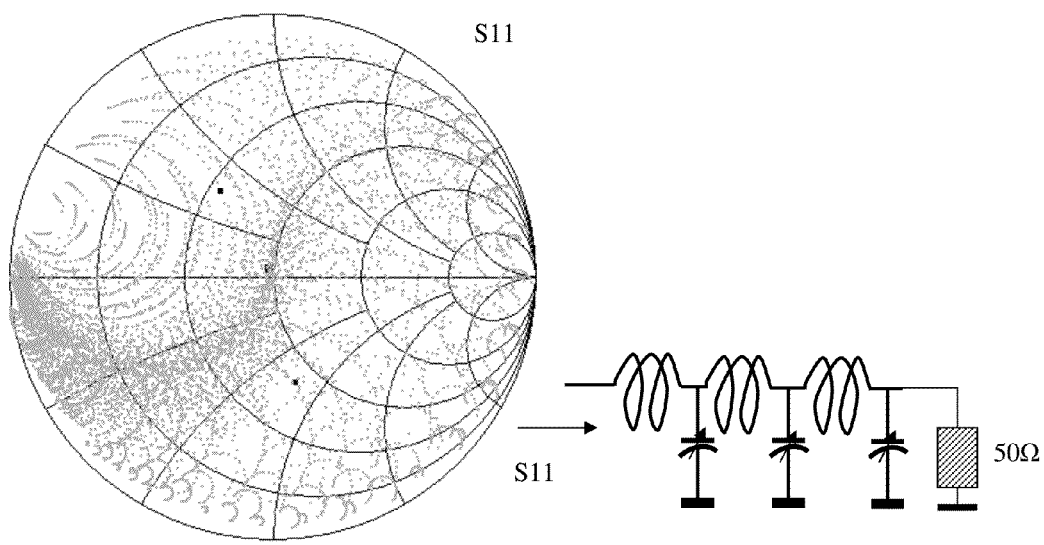
FIGURE 11: Measured Impedances of Low Frequency Impedance Tuner at 10MHz.

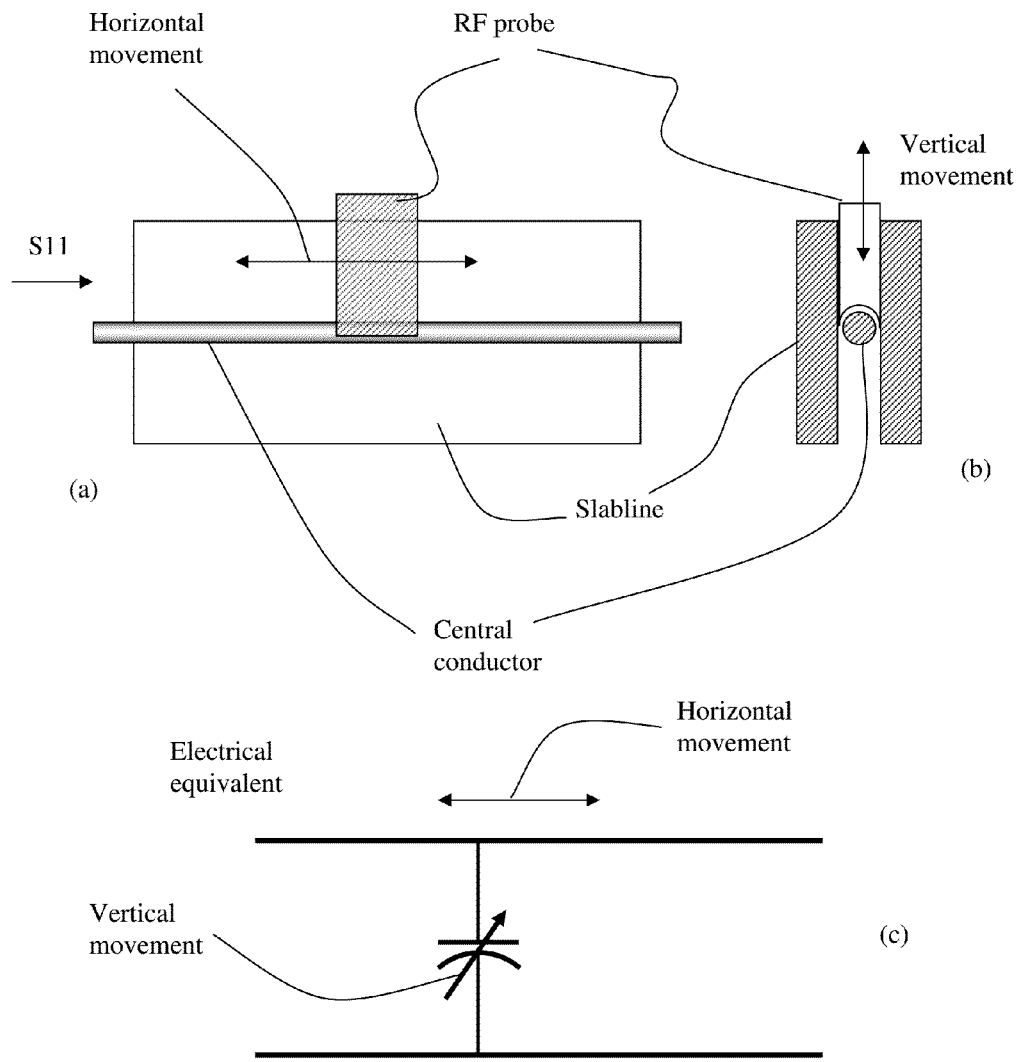
FIGURE 12: Prior art, front view (a), cross section (b) and electrical equivalent (c) of RF slide screw tuner

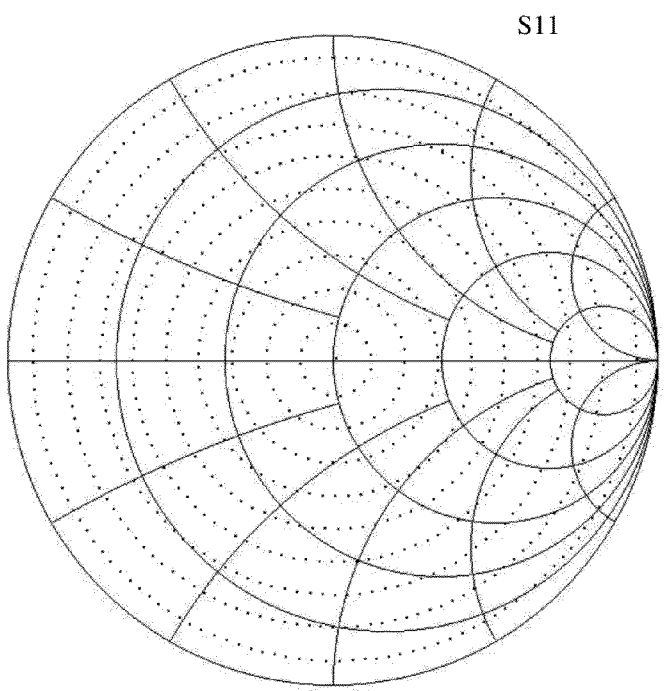
FIGURE 13: Prior art, Measured tuning capability of RF slide screw tuner at RF and Microwave Frequencies.

us 9,310,410 B1

LOAD AND SOURCE PULL TEST SYSTEM FOR RF AND BASEBAND FREQUENCIES

CROSS REFERENCE

This application is a continuation of U.S. Non-Provisional patent application Ser. No. 13/371,587 filed Feb. 13, 2012 and titled CALIBRATION PROCEDURE FOR A LOAD AND SOURCE PULL TEST SYSTEM FOR RF AND BASEBAND FREQUENCIES, which itself is a continuation of application Ser. No. 12/219,793, filed Jul. 29, 2008 and titled LOAD AND SOURCE PULL SETUP FOR RF AND BASEBAND FREQUENCIES, both of which are incorporated herein by reference in their entireties.

PRIORITY CLAIM

Not applicable.

CROSS-REFERENCE TO RELATED ARTICLES

[1] U.S. patent application Ser. No. 11/498,241, Load pull tuner using self-aligning single and double probes.
[2] "Three probe tuner tackles multiple tasks", Microwaves & RF Magazine, February 2005, page 90ff.
[3] U.S. Pat. No. 7,646,267, "Low Frequency Electromechanical Impedance Tuner."
[4] "High-Power Load Pull at 40 MHz Using Low Frequency iTuners (iLFT)", Powerpoint presentation, at IMS 2007.
[5] "Adjacent Channel Power ratio (ACPR)", application note, Anritsu Corporation.
[6] "Error Vector Magnitude (EVM)", article from Wikipedia.
[7] "Intermodulation (IMD)", article from Wikipedia.
[8] "RF Directional Couplers and 3 dB Hybrids; Overview," Application Note M560, MA/COM
[9] "3 dB Couplers (Coaxial)," Catalogue, Cernex, Inc.
[10] U.S. Pat. No. 7,385,461, "Method on combining signals and device thereof"
[11] U.S. Pat. No. 6,674,293, "Adaptable Pre-Matched Tuner System and Method"

STATEMENT REGARDING FEDERALLY SPONSORED RESEARCH OR DEVELOPMENT

Not Applicable

REFERENCE TO SEQUENCE LISTING, A TABLE, OR A COMPUTER PROGRAM LISTING COMPACT DISC APPENDIX

Not Applicable

BACKGROUND OF THE INVENTION

This invention relates to load pull testing of microwave power transistors using automatic microwave tuners for synthesizing reflection factors (or impedances) and matching the transistors (device under test, or DUT) at the input and output at the baseband, the RF fundamental and the harmonic frequencies.

Modern design of high power microwave amplifiers, mixers and other semiconductor RF components used in various communication systems requires accurate knowledge of the active device's (microwave transistor's) characteristics. In such circuits, it is insufficient and inaccurate for the transistors operating at high power in their highly non-linear regions and close to saturation, to be described using analytical or numerical models only. Instead the devices need to be characterized using specialized test setups using tuners and other test equipment under the actual operating conditions.

A popular method for testing and characterizing transistors for high power operation is "load pull" and "source pull". Load pull or source pull are measurement techniques employing signal sources, RF impedance tuners (input and output), DUT's in test fixtures on on-wafer and other test equipment, like a Power Meter, as shown in FIG. 1; a control computer recalls tuner calibration data and positions the tuners to create the desired impedances and reads instrument data via GPIB communication.

Electro-mechanical slide screw tuners [1] are used in most cases for high power load pull testing, because they have several advantages, such as long-term stability, higher handling of RF power, easy operation and low cost.

In the setup of FIG. 1 the RF impedance tuners can be wideband slide screw tuners [1] or harmonic tuners [2, 11]. In case of a two-probe tuner [11] the fundamental frequency (Fo) and the first harmonic frequency (2Fo) impedances are controlled. In case of a three-probe tuner [2] the fundamental frequency (Fo) and two harmonic frequencies (2Fo and 3Fo) can be controlled independently. If such harmonic tuners are used then the DUT can be tested under controlled impedance conditions, either for the fundamental frequency (Fo) only, or for Fo and harmonic frequencies 2Fo, 3Fo etc.

In all cases of communication protocols the RF signal is not pure carrier wave (CW) but includes some kind of modulation. In these cases the signal spectrum spreads around the main carrier wave (RF) and the bandwidth depends on the information carried and the modulation techniques used. Modern telecommunication schemes require sidebands of several MHz up to a few dozens of MHz (FIG. 2). If the transistors are operated in their nonlinear regime, as is the normal case, the upper and lower sideband frequencies are mixed down into the baseband and from there they interact with the DC biasing circuitry and get mixed up into the RF signal again to interact with the original modulation signals (FIGS. 3, 4). This phenomenon is undesired and, if not properly controlled, leads to deteriorated RF performance of the amplifier. Therefore a control of the baseband impedance is required.

BACKGROUND OF THE INVENTION

This invention describes an automated Load Pull test setup, which allows controlling and optimizing not only, as existing load pull setups do, the RF impedances seen by the DUT, but also, at the same time, the low frequency impedances, at baseband frequency range, generally presented to the DUT by the DC biasing networks. Bias networks are, in general, not part of the amplifier design considerations, beyond the fact that they are supposed to allow RF signal to pass through with as low insertion loss as possible, and DC bias to pass through to the power supply, again with as low series ohmic resistance as possible. Typical LC bias networks, also called Bias Tees, are shown in FIGS. 5, 8. The only RF consideration for the DC path of Bias Tees to date has been amplifier stability: since transistors have higher gain at low frequencies down to baseband frequencies, risk of spurious oscillations due to inadequate biasing networks needs to be eliminated. This, in general, is attempted to and often achieved, using a dump resistor connected in parallel at the input port (gate or base) of the transistor (DUT).

DESCRIPTION OF PRIOR ART

In this context prior art is limited to the use of standard equipment, like signal sources, power meters, spectrum analyzers etc. and RF wideband [1], harmonic [2] and low frequency tuners [3] for various load pull testing applications at the corresponding frequencies [4]. Using low frequency automatic tuners to map the baseband frequency impedances in an RF load pull setup is new.

BRIEF DESCRIPTION OF THE SEVERAL VIEWS OF THE DRAWINGS

The invention and its mode of operation will be more clearly understood from the following detailed description when read with the appended drawings in which:

FIG. 1 depicts prior art, a typical automated load pull test setup. RF impedance tuners can be wideband or harmonic tuners.

FIG. 2 depicts prior art, modulated signal amplified and down-converted by a nonlinear transistor; non-proportional frequency scale and frequency examples are used for demonstration purposes.

FIG. 3 depicts prior art, baseband impedance effect on transistor amplifier operation.

FIG. 4 depicts, baseband impedance effect on transistor amplifier operation emphasizing the creation of down-converted and up-converted baseband currents.

FIG. 5 depicts, load pull setup using LC bias tee and low frequency tuner to control bias network impedance.

FIG. 6 depicts, load pull setup using coupler based bias tee and low frequency tuner to control bias network impedance.

FIG. 7 depicts a 3 dB coupler based bias tee allowing RF and DC power to be combined at one port of the four port bias network.

FIG. 8 depicts the impedances seen at various reference planes and the various frequencies in the setup of FIG. 5 for two basic frequency ranges: RF ~1-5 GHz range and F-BB (baseband) ~1-20 MHz range. The input LC bias tee can be replaced with a coupler-based bias tee.

FIG. 9 depicts prior art, low frequency impedance tuner, the transmission lines may be coaxial cables of certain length or air coils, depending on the frequency range.

FIG. 10 depicts prior art, rotating air capacitor mounted on stepper motor, as used in low frequency tuner.

FIG. 11 depicts prior art, measured impedance tuning capability of low frequency impedance tuner at 10 MHz. The plot includes 1000 reflection factor points of a low frequency impedance tuner, which is terminated by a 50Ω load.

FIG. 12 depicts prior art, front view (a), cross section (b) and electrical equivalent (c) of RF slide screw tuner.

FIG. 13 depicts prior art, measured reflection factor points of RF impedance slide screw tuner at RF and microwave frequencies (>100 MHz).

DETAILED DESCRIPTION OF THE INVENTION

The setup proposed here uses DC Bias Tees as a frequency Diplexer (or frequency separator) FIGS. 5, 6, 8. The Bias Tee allows RF frequencies to pass through from the signal source to the DUT at very low insertion loss. A blocking chip capacitor of adequate size (1 to a few Picofarad, pF, FIGS. 4, 5) inserted in the signal path is an appropriate solution. The DC path is blocked for the RF signal by an inductor (FIG. 5). The power supply following the inductor has, in general, very low internal impedance, close to 0Ω. Sometimes a high value parallel capacitor is connected after the inductor to make certain the foot of the inductor is properly grounded (not shown in FIG. 5). The Bias Tee inductor and following power supply, including shunt capacitor and possible cables represent a non-negligible impedance at baseband frequencies up to around 20 MHz! Instead it does represent unknown and uncontrolled impedance, which has, in many cases, a deteriorating effect on the performance of the amplifier due to down- and- up converted modulation signals, as shown in FIGS. 3, 4. This is a typical undesired phenomenon measured when modulated signals pass through the test system and DC bias passes through long DC cables.

The sideband signals at the output of the nonlinear amplifier DUT create, through the frequency conversion mechanism of said nonlinear amplifier, a down-converted signal (current) at the baseband frequency at the input of the DUT (FIG. 4). This low frequency signal does not pass through to the signal source due to the blocking capacitor; instead it passes through the bias network impedance Zbb and, following Ohm's law (Vbb=Zbb*Ibb), creates a voltage Vbb at baseband frequency. This secondary voltage then, depending on the baseband impedance (Zbb), drives the amplifier and generates an up-converted secondary current at the output (FIG. 4), which interacts with and affects the original modulated signal. This interaction in general deteriorates the amplifier's performance if not controlled properly. Thus the necessity to control and optimize the amplitude and phase of this secondary signal.

The test setup described here allows controlling the baseband impedance presented to the device and optimizing the performance of the amplifier concerning modulation based quantities such as Adjacent Channel Power Ratio (ACPR) [5], Error Vector Magnitude [6], Inter-modulation [7] and more. Up to now baseband impedance-mapping of those quantities has not been reported in the literature, possibly because of non-availability of calibrated automatic baseband frequency tuners [3].

The setup of FIG. 5, allows mapping the modulation performance of the DUT (amplifier) as a function of the RF frequency and the baseband frequency impedances.

An alternative setup is shown in FIG. 6. It contains a "3 dB coupler" based bias tee network (FIG. 7). The coupler based bias tee network uses two "phase-matched" 3 dB couplers [8, 9, 10] and combines signals from two input ports into one output port, whereas the two signals are cancelled on the other output port, which is connected, typically, to a 50Ω load. The two signals to be combined in our case are the RF signal from the signal source and the DC bias power from the power supply, which are then fed into the DUT input port. The advantage of this bias network is that it does not distort any signal into the DC bias port, because it allows straight galvanic contact without the interference of an inductor. The disadvantage is that it only works in the frequency range of the 3 dB coupler, which is limited to the components available commercially [9]. In both cases (FIGS. 5, 6) the input bias network acts as a frequency separator or diplexer.

FIG. 8 illustrates the various impedances seen at the different test ports and at the different interfering frequencies: Looking into the blocking capacitor towards the signal source we see 50Ω at the signal (RF) frequency, which is the typical internal impedance of the signal source and we see an open circuit at the baseband frequency (Fbb), because of the relative small size of the blocking capacitor. Looking into the inductor (L) of the input bias network we see the impedance of the inductor (jωL, with {ω=2*π*frequency}); because of the relatively small value of the inductance (L) we also see by the impedance of the low frequency tuner (FIGS. 9, 11). As FIG. 11 shows the impedance of the low frequency tuner can be controlled over the entire area of the Smith Chart, from values close to 0Ω to 50Ω and ∞ and also include all capacitive and inductive values.

Looking from the DUT's input port into the input tuner we see the combination of the input tuner RF impedance at RF signal frequency, and the tuner baseband impedance (Zbb) at low (baseband) frequencies. This is possible, because the input tuner used is a slide screw tuner (FIG. 12 a, b, c) which reflects high frequencies but is perfectly transparent at low frequencies, as can be seen from FIG. 12 (c). The capacitor representing the electrical coupling between the RF probe and the central conductor (FIG. 12 (a), (b)) is low and transparent at baseband frequencies, but creates a measurable shunt reactance $Zc=1/j\omega C$ at high (RF) frequencies, with $\{\omega=2*\pi*frequency\}$. When the RF probe moves horizontally and vertically inside the tuner slabline then reflection factors (=impedances) are created as shown in FIG. 13, [1].

By combining the impedances of FIG. 11 for the low frequency baseband tuner with the impedances of FIG. 13 for the RF frequency band tuner we can then measure the amplifier performance as a function of either impedances parameter and optimize the ACPR, EVM, IMD etc. result accordingly. Once the optimum conditions have been found a corresponding RF and baseband network can be designed and manufactured using available circuit synthesis algorithms and design software.

The measured impedances of RF and baseband tuners (FIGS. 11, 13) are generated by measuring scattering parameters (s-parameters) of each said tuner between its test ports using a pre-calibrated vector network analyzer (VNA); s-parameters are measured for a number of tuner states (=horizontal and vertical probe positions for said RF tuners [1] and capacitor positions [3] for said low frequency (baseband) tuners); the measured s-parameters are saved in form of "calibration data files" on the hard-disk of the control computer, or other storage media, and are retrieved during load pull measurements, in order to configure said tuners in such a way as to reproduce the impedances contained in said calibration files. This then allows measuring and mapping said DUT's performance as a function of said tuner's impedances and search for an optimum solution.

Although the present invention has been explained hereinabove by way of a preferred embodiment thereof, it should be pointed out that other combinations of the described components are possible and, as far as obvious to a person skilled in the art, they shall not limit the scope of the present invention.

I claim:

1. A test setup comprising a cascade of a low frequency modulated RF signal source, an input and an output DC bias network, said input bias network having an input (RF) port, an output (RF & DC) port and a bias (DC) port, and said output bias network having an input (RF & DC) port, an output (RF) port and a bias (DC) port;

and an automated single probe input high frequency (RF) impedance tuner, a test fixture having an input section and an output section, a device to be tested (DUT), mounted between the input and output sections of said test fixture, an automated single probe output (RF) impedance tuner and an RF load;

and an automated, baseband low frequency (LF) impedance tuner comprising sections of series coaxial lines and shunt variable capacitors, said LF tuner being connected in series between the input DC port of the input bias network and RF grounded DC bias supply.

2. A test setup as in claim 1 whereby the RF tuners are multi-probe slide screw tuners capable of tuning independently at harmonic frequencies.

3. A test setup as in claim 1 or 2 whereby the modulated signal is injected into the DUT after passing through the input bias network, the input tuner and the input section of said test fixture;

and whereby said signal is extracted from the DUT and injected into the RF load after passing through the output section of the test fixture, the output bias network and the output tuner;

and whereby said DC bias is injected into said DUT through the DC ports of said input and output bias networks.

4. A test setup as in claim 3, whereby the RF source and load impedances are generated using programmable high frequency input and output impedance tuners correspondingly.

5. A test setup as in claim 4, whereby the baseband frequency (Fbb) impedance is generated by programmable low frequency (LC-based) baseband tuners.

6. A test setup as in claim 1 whereby the RF tuners comprise a cascade of at least two independent wideband tuning modules and are capable of tuning independently for at least two harmonic frequencies.

7. A test setup as in claim 1 whereby the DC bias networks comprises two back-to-back connected 3 dB hybrid couplers, each said coupler having four ports, ports 1 and 2 being the input ports and ports 3 and 4 being the output ports;

whereby the two opposite ports (1 and 3, 2 and 4) are RF coupled but DC decoupled and the two diagonal ports (1 and 4, 2 and 3) are RF and DC coupled to each other;

and whereby port 3 of the first coupler is connected to port 1 of the second coupler and port 4 of the first coupler is connected to port 2 of the second coupler;

and whereby port 1 of the first coupler receives the DC bias injected through the low frequency tuner and port 2 of the first coupler receives the RF signal and port 3 of the second coupler supplies RF and DC signal to the DUT and port 4 of said second coupler is terminated with the characteristic impedance Zo.

* * * * *